(12) United States Patent
Sato

(10) Patent No.: US 7,652,857 B2
(45) Date of Patent: Jan. 26, 2010

(54) TUNNELING MAGNETIC SENSING ELEMENT HAVING TWO-LAYER INSULATING FILM

(75) Inventor: Kiyoshi Sato, Niigata-ken (JP)

(73) Assignee: TDK Corporation, Tokyo (JP)

( * ) Notice: Subject to any disclaimer, the term of this patent is extended or adjusted under 35 U.S.C. 154(b) by 349 days.

(21) Appl. No.: 11/421,709

(22) Filed: Jun. 1, 2006

(65) Prior Publication Data
US 2006/0279881 A1 Dec. 14, 2006

(30) Foreign Application Priority Data
Jun. 8, 2005 (JP) ............... 2005-168218

(51) Int. Cl.
G11B 5/127 (2006.01)
G11B 5/33 (2006.01)
(52) U.S. Cl. .............................. 360/324.12; 360/324.2
(58) Field of Classification Search ............. 360/324.1, 360/324.11, 324.12, 324.2, 327.2, 327.23, 360/327.3, 327.31
See application file for complete search history.

(56) References Cited

U.S. PATENT DOCUMENTS

| | | | | |
|---|---|---|---|---|
| 5,729,410 A | * | 3/1998 | Fontana et al. | ........... 360/324.2 |
| 2003/0039080 A1 | | 2/2003 | Kagami et al. | |
| 2003/0189802 A1 | * | 10/2003 | Morinaga et al. | ...... 360/324.12 |
| 2004/0008455 A1 | * | 1/2004 | Hasegawa et al. | ...... 360/324.12 |
| 2004/0061986 A1 | | 4/2004 | Kagami et al. | |
| 2004/0160700 A1 | | 8/2004 | Kagami et al. | |
| 2005/0018365 A1 | * | 1/2005 | Gill | ........................ 360/324.11 |
| 2005/0073778 A1 | * | 4/2005 | Hasegawa et al. | ......... 360/324.1 |
| 2005/0146812 A1 | * | 7/2005 | Fontana et al. | ........... 360/324.2 |
| 2006/0087772 A1 | * | 4/2006 | Pinarbasi | ............... 360/324.12 |
| 2007/0035888 A1 | * | 2/2007 | Sbiaa et al. | .............. 360/324.1 |

FOREIGN PATENT DOCUMENTS

| | | |
|---|---|---|
| EP | 0 953 849 | 11/1999 |
| JP | 10-162327 | 6/1998 |
| JP | 2002-359416 | 12/2002 |
| JP | 2003-086861 | 3/2003 |
| JP | 2004-253437 | 9/2004 |

OTHER PUBLICATIONS

First Office Action for corresponding Chinese Patent Application Serial No. 200610091710.5, dated Aug. 3, 2007.
Search Report for corresponding Great Britain Patent Application Serial No. GB0608314.1, dated Aug. 25, 2006.

* cited by examiner

Primary Examiner—Brian E Miller
(74) Attorney, Agent, or Firm—Brinks Hofer Gilson & Lione

(57) ABSTRACT

A magnetic sensing element is provided. The magnetic sensing element includes a laminate disposed on a conductive layer. The laminate having a structure including a pinned magnetic layer, a nonmagnetic layer, and a free magnetic layer disposed in that order from the bottom, first insulating films disposed at both sides in the track width direction of the laminate, second insulating films disposed on the conductive layer, the second insulating films being connected to the respective first insulating films, bias layers disposed over the respective first insulating films and the respective second insulating films, wherein the thickness in the track width direction of the first insulating film is smaller than the thickness of the second insulating film.

6 Claims, 6 Drawing Sheets

TUNNELING MAGNETIC SENSING ELEMENT HAVING TWO-LAYER INSULATING FILM

BACKGROUND

1. Field of the Invention

A magnetic sensing element, such as a tunneling magnetic sensing element, having an insulating film interposed between a laminate including a free magnetic layer and a bias layer disposed at each side in the track width direction of the laminate is provided.

2. Related Art

FIG. 11 is a partial cross-sectional view showing a conventional tunneling magnetic sensing element, taken in a direction parallel to the surface facing a recording medium (i.e., a surface parallel to the X-Z plane in the drawing).

A laminate 7 is disposed on a lower shielding layer 1, the laminate 7 including an antiferromagnetic layer 2, a pinned magnetic layer 3, an insulating barrier layer 4, a free magnetic layer 5, and a protective layer 6 disposed in that order from the bottom. The antiferromagnetic layer 2 is, for example, composed of a PtMn alloy, and the magnetization of the pinned magnetic layer 3 is pinned in the height direction (in the Y direction in the drawing) by an exchange coupling magnetic field produced between the antiferromagnetic layer 2 and the pinned magnetic layer 3.

The insulating barrier layer 4 is, for example, composed of $Al_2O_3$.

As shown in FIG. 11, first insulating films 8 are disposed at both sides in the track width direction (in the X direction in the drawing) of the laminate 7. Second insulating films 9 are disposed on the upper surface of the lower shielding layer 1 extending at both sides of the laminate 7 in the track width direction (in the X direction), the second insulating films 9 being connected with the respective first insulating films 8. Hard bias layers 10, for example, composed of a CoPt alloy are disposed on the respective first insulating films 8 and the respective second insulating films 9. Buried layers 11 are disposed on the respective hard bias layers 10. As shown in FIG. 11, an upper shielding layer 12 is disposed over the protective layer 6 and the buried layers 11. The lower shielding layer 1 and the upper shielding layer 12 also serve as electrodes, and a current flows through the laminate 7 in a direction parallel to the Z direction.

As shown in FIG. 11, the first insulating film 8 is provided to maintain insulation between the hard bias layer 10 and the laminate 7, and the second insulating film 9 is provided to maintain insulation between the hard bias layer 10 and the lower shielding layer 1.

Tunneling magnetic sensing elements are disclosed, for example, in Japanese Unexamined Patent Application Publication No. 2004-253437 (Patent Document 1) and Japanese Unexamined Patent Application Publication No. 10-162327 (Patent Document 2).

In the conventional tunneling magnetic sensing element, the thicknesses of the first insulating film 8 and the second insulating film 9 are not particularly controlled.

In order to ensure insulation between the hard bias layer 10 and the laminate 7 and between the hard bias layer 10 and the lower shielding layer 1, both the thickness T1 in the track width direction (in the X direction) of the first insulating film 8 and the thickness T2 of the second insulating film 9 are increased.

However, if the thickness T1 of the first insulating film 8 is excessively increased, the bias magnetic field supplied from the hard bias layer 10 to the free magnetic layer 5 is decreased, and it becomes difficult to properly align the magnetization of the free magnetic layer 5 in the track width direction (in the X direction).

If the thickness T1 of the first insulating film 8 is decreased, the problem described above is solved. However, if the thickness T2 of the second insulating film 9 is also decreased by the same extent as the thickness T1 of the first insulating film 8, short-circuiting more easily occurs between the hard bias layer 10 and the lower shielding layer 1 compared with between the hard bias layer 10 and the laminate 7, which is undesirable. The reason for this is that the area of the region in which the second insulating film 9 is formed is greatly larger than the area of the region in which the first insulating film 8 is formed, and the probability of the occurrence of pinholes and the like in the second insulating film 9 is higher than that in the first insulating film 8, thus increasing the occurrence of short-circuiting between the lower shielding layer 1 and the hard bias layer 10 through the pinholes.

As is evident with reference to FIG. 8, etc., of Patent Document 1, the first insulating films 8, the second insulating films 9, the hard bias layers 10, etc., are formed at both sides in the track width direction of the laminate 7 with a resist layer for lift-off processing (represented by reference numeral 71 in FIG. 8 of Patent Document 1) being placed on the upper surface of the laminate 7. However, when the resist layer for lift-off processing is used, if the first insulating film 8 is formed with a large thickness in the vicinity of an undercut portion (represented by reference numeral 71a of FIG. 8 in Patent Document 1), and in the worst case, if the inside of the undercut portion is filled with the insulating film 8, the resist layer cannot be lifted off. Therefore, as the first insulating film 8 is tapered upward (toward the end in the Z direction), the resist layer is more easily lifted off, which is preferable. However, if the first insulating film 8 is tapered upward, insulation between the laminate 7 and the hard bias layer 10 is degraded in the end portion, and as a result, short-circuiting easily occurs. In order to prevent the material of the hard bias layer 10 from entering the undercut portion when the hard bias layer 10 is deposited, it is preferable to control the deposition angle and the like during the deposition of the hard bias layer 10. However, this causes a problem of a decreased bias magnetic field supplied from the hard bias layer 10 to the free magnetic layer 5. Moreover, because of the shadow effect in which the sides of the resist layer produce shadowing, resulting in difficulty in film formation, the thicknesses of the first insulating film 8 and the hard bias layer 10 in the vicinity of the resist layer are further decreased.

Furthermore, if the thickness T2 of the second insulating film 8 is small, as shown in FIG. 11, the position of the hard bias layer 10 is lowered, and the thickest portions of the hard bias layers 10 tend to be located lower than both sides in the track width direction of the free magnetic layer 5. As a result, the bias layer supplied from the hard bias layer 10 to the free magnetic layer 5 tends to be decreased.

SUMMARY

The present invention has been achieved to overcome the problems associated with the conventional technique. A magnetic sensing element in which a bias magnetic field with a proper magnitude can be supplied to the free magnetic layer while maintaining insulation between the hard bias layer and the laminate, and a method for fabricating the magnetic sensing element is provided.

A magnetic sensing element includes a laminate disposed on a conductive layer, the laminate having a structure including a pinned magnetic layer, a nonmagnetic layer, and a free magnetic layer disposed in that order from the bottom, first insulating films disposed at both sides in the track width direction of the laminate, second insulating films disposed on the conductive layer, the second insulating films being connected to the respective first insulating films, bias layers disposed over the respective first insulating films and the respective second insulating films, wherein the thickness in the track width direction of each first insulating film is smaller than the thickness of each second insulating film.

Since the thickness in the track width direction of the first insulating film is smaller than the thickness of the second insulating film, the distance in the track width direction between the free magnetic layer and the bias layer is decreased, and it is possible to supply a bias magnetic field with a proper magnitude from the bias layer to the free magnetic layer. Even if the thickness in the track width direction of the first insulating film is smaller than the thickness of the second insulating film, the region in which the first insulating film is to be formed is at the side in the track width direction of the laminate, and the area thereof is greatly smaller than that of the region in which the second insulating film is to be formed. Consequently, even if the thickness of the first insulating film is small, insulation between the bias layer and the laminate can be maintained satisfactorily and the probability of the occurrence of short-circuiting can be suppressed. On the other hand, since the thickness of the second insulating film is large, the distance between the bias layer and the conductive layer is adequately large. Consequently, insulation between the bias layer, which is formed in a larger region compared with the first insulating film, and the conductive layer can be maintained satisfactorily and the probability of the occurrence of short-circuiting can be suppressed.

Preferably, the upper surface of each second insulating film is located lower than the upper surface of the nonmagnetic layer from the standpoint that a bias magnetic field with a proper magnitude can be supplied from the bias layer to the free magnetic layer.

Preferably, the thickness in the track width direction of each first insulating film is set at a constant value. Thereby, insulation between the laminate and the bias layer can be maintained satisfactorily, and a bias magnetic field with a proper magnitude can be supplied from the bias layer to the free magnetic layer.

Preferably, the thickness of each second insulating film is set at a constant value. Thereby, insulation between the conductive layer and the bias layer can be maintained satisfactorily.

Preferably, the thickness in the track width direction of each first insulating film is in a range of 1 nm to 20 nm.

Preferably, at least the first insulating films each have two layers including an inner insulating layer in contact with the laminate and an outer insulating layer disposed on the inner insulating layer, and the inner insulating layer functions as an oxidation-inhibiting layer that inhibits oxidation of the laminate more reliably compared with a case in which the outer insulating layer and the laminate are disposed in contact with each other. Depending on the material used for the first insulating film, if the material is directly deposited at the side in the track width direction of the laminate, the side of the laminate may be oxidized, resulting in a decrease in read characteristics. Therefore, it is preferable to dispose an oxidation-inhibiting layer as the inner insulating layer of the first insulating film in order to inhibit the oxidation.

Preferably, the inner insulating layer has a single-layer structure or a multilayer structure composed of a material or materials selected from the group consisting of $Si_3N_4$, $SiN_x$, $WO_x$, $SiO_2$, $SiO_x$, SiON, $Ta_2O_5$, $TaO_x$, and TiN. Preferably, the outer insulating layer has a single-layer structure or a multilayer structure composed of a material or materials selected from the group consisting of $Al_2O_3$, $SiO_2$, AlSiO, and SiAlON.

For example, the magnetic sensing element of the present invention may be a tunneling magnetic sensing element in which the nonmagnetic layer is composed of an insulating barrier layer.

A method for fabricating a magnetic sensing element includes the steps of (a) forming a laminate on a conductive layer, the laminate having a structure including a pinned magnetic layer, a nonmagnetic layer, and a free magnetic layer disposed in that order from the bottom; (b) forming first insulating films at both sides in the track width direction of the laminate and forming second insulating films on the conductive layer, the second insulating films being connected to the respective first insulating films, the thickness in the track width direction of each first insulating film being set smaller than the thickness of each second insulating film; and (c) forming bias layers over the respective first insulating films and the respective second insulating films.

Thereby, it is possible to easily and properly fabricate a magnetic sensing element in which the distance between the bias layer and the free magnetic layer can be decreased to such an extent that a bias magnetic field with a proper magnitude can be supplied from the bias layer to the free magnetic layer and in which insulation between the first insulating film and the laminate and between the second insulating film and the conductive layer can be satisfactorily maintained.

In step (b), preferably, the second insulating films are formed such that the upper surface of each second insulating film is at least lower than the upper surface of the nonmagnetic layer. In particular, by controlling the position at which the second insulating film is formed on the basis of the upper surface of the nonmagnetic layer, even if the layer structure of the laminate, the thicknesses of the individual layers, and the like are changed, it is possible to place bias layers having an adequate thickness at both sides in the track width direction of the free magnetic layer.

In step (b), preferably, the first insulating films and the second insulating films are formed at two or more different deposition angles so that the thickness in the track width direction of each first insulating film is smaller than the thickness of each second insulating film. Thereby, the thickness in the track width direction of the first insulating film and the thickness of the second insulating film can be easily and properly controlled.

Preferably, the fabrication method of the present invention further includes, subsequent to step (c), the steps of (d) forming stopper layers on the respective bias layers, and (e) terminating a process of removing unnecessary layers formed on the upper surface of the laminate at the point at which the stopper layers are at least partially removed.

Thereby, the amount of removal can be properly controlled, and in particular, the laminate and the bias layer can be properly prevented from being excessively removed.

Furthermore, in the fabrication method of the present invention, in step (b), preferably, at least the first insulating films are each formed so as to have two layers including an inner insulating layer in contact with the laminate and an outer insulating layer disposed on the inner insulating layer, the inner insulating layer being composed of a material that inhibits oxidation of the laminate more reliably compared with a case in which the outer insulating layer and the laminate are disposed in contact with each other. In such a case, preferably, the inner insulating layer has a single-layer structure or a multilayer structure composed of a material or materials selected from the group consisting of $Si_3N_4$, $SiN_x$, $WO_x$, $SiO_2$, $SiO_x$, SiON, $Ta_2O_5$, $TaO_x$, and TiN. Preferably, the outer insulating layer has a single-layer structure or a multilayer structure composed of a material or materials selected from the group consisting of $Al_2O_3$, $SiO_2$, AlSiO, and SiAlON.

Since the thickness in the track width direction of the first insulating film disposed at each side in the track width direction of the laminate is set smaller than the thickness of the second insulating film, the distance between the free magnetic layer constituting the laminate and the bias layer disposed over the first insulating film and the second insulating film can be decreased, and it is possible to supply a bias magnetic field with a proper magnitude from the bias layer to the free magnetic layer.

Furthermore, even if the thickness in the track width direction of the first insulating film is set smaller than the thickness of the second insulating film, the region in which the first insulating film is to be formed is at the side in the track width direction of the laminate, and the area thereof is greatly smaller than that of the region in which the second insulating film is to be formed.

Consequently, even if the thickness of the first insulating film is set small, insulation between the bias layer and the laminate can be maintained satisfactorily and the probability of the occurrence of short-circuiting can be suppressed. On the other hand, since the thickness of the second insulating film is large, the distance between the bias layer and the conductive layer is adequately large. Consequently, insulation between the bias layer, which is formed in a larger region compared with the first insulating film, and the conductive layer can be maintained satisfactorily and the probability of the occurrence of short-circuiting can be suppressed.

DESCRIPTION OF THE PREFERRED EMBODIMENTS

Figure 1:
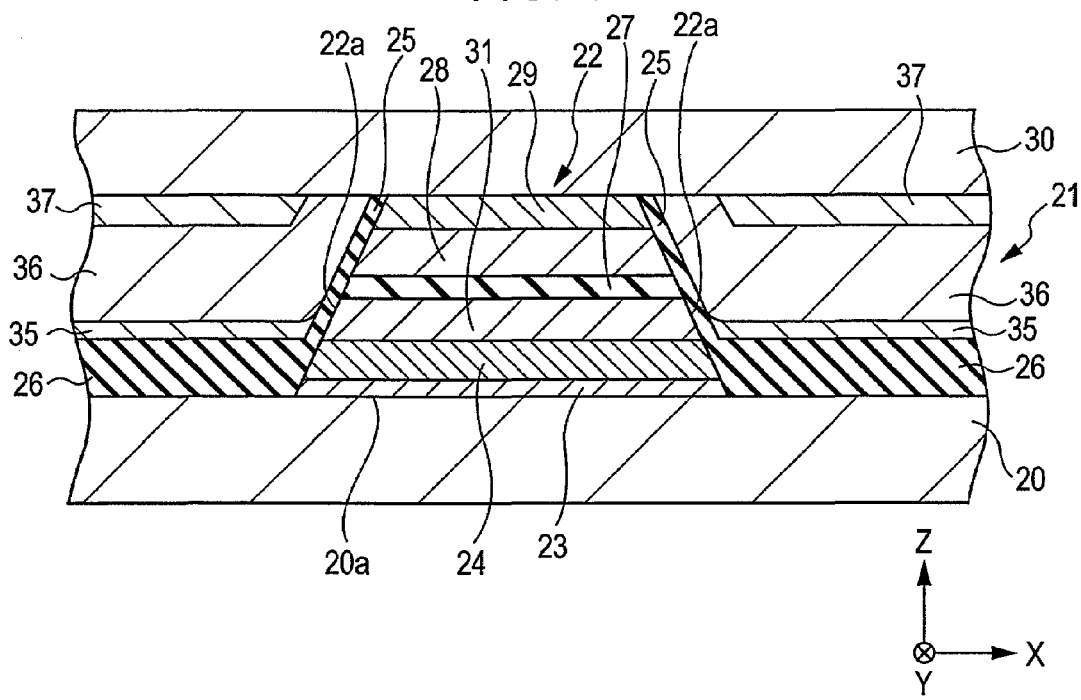
FIG. 1 is a partial cross-sectional view showing a tunneling magnetic sensing element taken in a direction parallel to the surface facing a recording medium.
Figure 2:
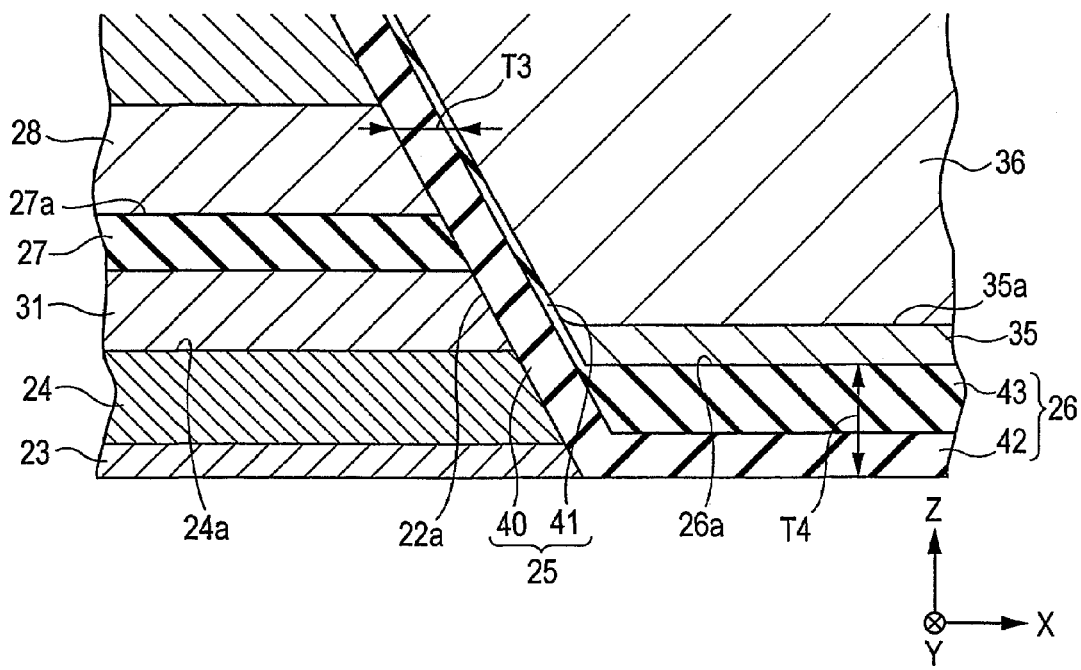
FIG. 2 is an enlarged partial cross-sectional view of the tunneling magnetic sensing element shown in FIG. 1.
Figure 3:
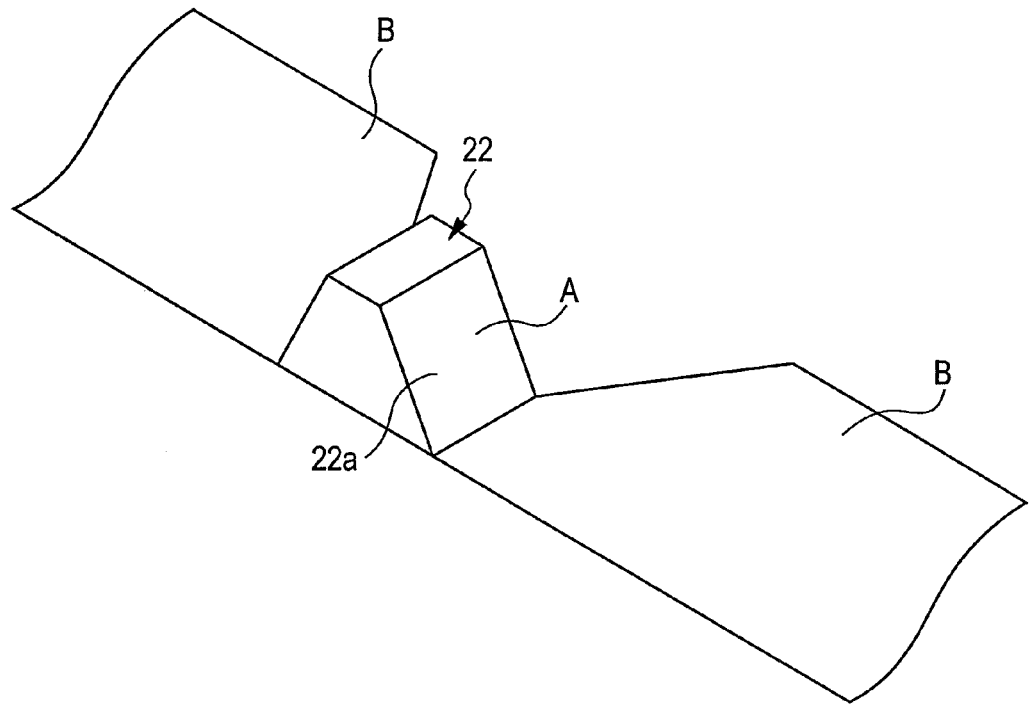
FIG. 3 is a partial perspective view showing a laminate and bias layer forming regions disposed at both sides of the laminate in the tunneling magnetic sensing element.

FIG. 1 is a partial cross-sectional view showing a tunneling magnetic sensing element, taken in a direction parallel to the surface facing a recording medium, FIG. 2 is an enlarged partial cross-sectional view of the tunneling magnetic sensing element shown in FIG. 1, and FIG. 3 is a partial perspective view showing a laminate and bias layer forming regions disposed at both sides of the laminate in the tunneling magnetic sensing element.

A tunneling magnetic sensing element 21 is disposed on the trailing end of a floating-type slider provided on a hard disk drive or the like to detect a recording magnetic field of a hard disk or the like. In the drawings, the X direction corresponds to the track width direction, the Y direction corresponds to the direction (height direction) in which a leakage magnetic field from a recording medium is applied, and the Z direction is the direction in which a magnetic recording medium, such as a hard disk, travels and also the direction in which the individual layers of the tunneling magnetic sensing element 21 are deposited. The X-Z plane is a plane parallel to the surface facing a recording medium.

As seen in FIG. 1, a lower shielding layer (conductive layer) 20 is composed of a magnetic material, such as an NiFe alloy.

An upper surface 20a of the lower shielding layer 20 is a surface for forming the tunneling magnetic sensing element 21, and a laminate 22 constituting the tunneling magnetic sensing element 21 is disposed on the upper surface 20a.

A seed layer 23 is a bottom layer in the laminate 22. The seed layer 23 is composed of NiFeCr, Cr, or the like. When the seed layer 23 is composed of NiFeCr, the seed layer 23 has a face-centered cubic (fcc) structure in which the equivalent crystal planes represented by the {111} planes are preferentially oriented in a direction parallel to the surfaces of the layer. When the seed layer 23 is composed of Cr, the seed layer 23 has a body-centered cubic (bcc) structure in which the equivalent crystal planes represented by the {110} planes are preferentially oriented in a direction parallel to the surfaces of the layer. An underlayer (not shown) may be disposed under the seed layer 23. The underlayer is composed of a nonmagnetic material, such as at least one element selected from the group consisting of Ta, Hf, Nb, Zr, Ti, Mo, and W.

An antiferromagnetic layer 24 is disposed on the seed layer 23. The antiferromagnetic layer 24 is preferably composed of X—Mn, wherein X is at least one element selected from the group consisting of Pt, Pd, Ir, Rh, Ru, and Os. In the present invention, the antiferromagnetic layer 24 may be composed of an X—Mn—X' alloy, wherein X' is at least one element selected from the group consisting of Ne, Ar, Kr, Xe, Be, B, C, N, Mg, Al, Si, Pt, V, Cr, Fe, Co, Ni, Cu, Zn, Ga, Ge, Zr, Nb, Mo, Ag, Cd, Sn, Hf, Xa, W, Re, Au, Pb, and rare-earth elements.

A pinned magnetic layer 31 is disposed on the antiferromagnetic layer 24. The pinned magnetic layer 31 is composed of a magnetic material, such as a CoFe alloy, an NiFe alloy, or Co. The structure of the pinned magnetic layer 31 is not particularly limited, and examples thereof include a single-layer structure, a structure in which a plurality of magnetic layers are laminated, and a laminated ferrimagnetic structure in which a nonmagnetic layer is interposed between magnetic layers.

An exchange coupling magnetic field is produced between the pinned magnetic layer 31 and the antiferromagnetic layer 24 by carrying out heat treatment, and the magnetization of the pinned magnetic layer 31 can be pinned in the height direction (in the Y direction).

An insulating barrier layer 27 is disposed on the pinned magnetic layer 31. The insulating barrier layer 27 is composed of $Al_2O_3$, $AlO_x$, $TiO_x$, $MgO_x$, or the like.

A free magnetic layer 28 is disposed on the insulating barrier layer 27. The free magnetic layer 28 is composed of an NiFe alloy, a CoFeNi alloy, a CoFe alloy, or the like. For example, preferably, the free magnetic layer 28 is composed of an NiFe alloy, and a diffusion prevention layer composed of Co or a CoFe alloy is disposed between the free magnetic layer 28 and the insulating barrier layer 27. The structure of the free magnetic layer 28 is not particularly limited, and examples thereof include a single-layer structure, a structure in which a plurality of magnetic layers are laminated, and a laminated ferrimagnetic structure in which a nonmagnetic layer is interposed between magnetic layers.

A protective layer 29 composed of Ta or the like is disposed on the free magnetic layer 28.

As shown in FIG. 1, side faces 22a in the track width direction (in the X direction) of the laminate 22 are inclined planes, and the width in the track width direction of the laminate 22 gradually decreases upward (in the Z direction). First insulating films 25 are disposed on the respective side faces 22a of the laminate 22. Second insulating films 26 are disposed on the upper surface 20a of the lower shielding layer 20 in regions extending at both sides in the track width direction of the laminate 22. The first insulating films 25 are connected to the respective second insulating films 26.

A bias underlayer 35 is disposed on each of the second insulating layers 26. The bias underlayer 35 is, for example, composed of Cr, CrTi, Ta/CrTi, or the like. The bias underlayer 35 is provided in order to improve the properties (coercive force Hc and remanence ratio S) of a hard bias layer 36.

The hard bias layer 36 is disposed over the first insulating film 25 and the second insulating film 26 through the bias underlayer 35. The hard bias layer 36 is composed of a CoPt alloy, a CoCrPt alloy, or the like. A bias magnetic field is supplied from the hard bias layer 36 to the free magnetic layer 28. The magnetization of the free magnetic layer 28 is aligned in the track width direction (in the X direction) by the bias magnetic field.

A protective layer 37 is disposed on each hard bias layer 36. The protective layer 37 is composed of Ta or the like.

The upper surface of the laminate 22, the upper surfaces of the protective layers 37, and the upper surfaces of the hard bias layers 36 exposed between the upper surface of the laminate 22 and the upper surfaces of the protective layers 37 are planarized. An upper shielding layer 30 is disposed over the planarized surface. The upper shielding layer 30 is composed of a magnetic material, such as an NiFe alloy.

In the tunneling magnetic sensing element 21 shown in FIG. 1, the lower shielding layer 20 and the upper shielding layer 30 also serve as electrodes. A current from the lower shielding layer 20 or the upper shielding layer 30 flows through the laminate 22 in a direction parallel to the Z direction (i.e., perpendicular to the surfaces of the individual layers constituting the laminate 22). The intensity of a tunnel current passing through the laminate 22 varies depending on the relationship in magnetization direction between the pinned magnetic layer 31 and the free magnetic layer 28.

When an external magnetic field enters the tunneling magnetic sensing element 21 in the Y direction, the magnetization of the free magnetic layer 28 changes under the influence of the external magnetic field. As a result, the tunnel current intensity also changes, and the change in the amount of current is detected as a change in electrical resistance. The change in electrical resistance is detected as a change in voltage, and thus the external magnetic field from a recording medium is detected.

The first insulating film 25 and the second insulating film 26 will be described in detail below. As shown in FIG. 2, the thickness T3 in a direction parallel to the track width direction (in the X direction) of the first insulating film 25 is smaller than the thickness T4 (in the Z direction) of the second insulating layer 26.

Thereby, it is possible to decrease the distance in the track width direction between the free magnetic layer 28 and the hard bias layer 36, which are opposed to each other through the first insulating film 25, and a bias magnetic field with a proper magnitude can be supplied from the hard bias layer 36 to the free magnetic layer 28. As a result, the magnetization of the free magnetic layer 28 can be properly aligned in the track width direction (in the X direction). Even if the thickness T3 of the first insulating layer 25 is decreased, as long as the thickness T3 is 1 nm or more, short-circuiting between the laminate 22 and the hard bias layer 36 can be properly suppressed.

As shown in FIG. 3, the side face 22a of the laminate 22 is a region in which the first insulating film 25 is formed, and an area A of this region is greatly smaller than an area B of a region in which the second insulating film 26 is formed at each side in the track width direction of the laminate 22. Consequently, even if the thickness T3 of the first insulating film 25 is small, defects, such as pinholes, are not easily formed in the first insulating film 25. Thus, insulation between the hard bias layer 36 and the laminate 22 can be maintained satisfactorily and short-circuiting between the hard bias layer 36 and the laminate 22 can be prevented.

On the other hand, the second insulating film 26 is formed in the region having a very large area B. If the thickness T4 of the second insulating film 26 is decreased as in the thickness T3 of the first insulating film 25, the probability of the formation of defects, such as pinholes, in the second insulating film 26 increases greatly compared with the first insulating film 25. Thus, short-circuiting easily occurs between the hard bias layer 36 and the lower shielding layer 20. Therefore, by setting the thickness T4 of the second insulating film 26 larger than the thickness T3 of the first insulating film 25, insulation between the hard bias layer 36 and the lower shielding layer 20 can be satisfactorily maintained, and short-circuiting between the hard bias layer 36 and the lower shielding layer 20 can be properly prevented.

Preferably, the thickness T3 of the first insulating layer 25 is 1 nm to 20 nm. If the thickness T3 is smaller than 1 nm, defects, such as pinholes, easily occur in the first insulating film 25, and short-circuiting easily occurs between the hard bias layer 36 and the laminate 22. On the other hand, if the thickness T3 exceeds 20 nm, the bias magnetic field supplied from the hard bias layer 36 to the free magnetic layer 28 becomes excessively small, and the magnetization of the free magnetic layer 28 cannot be properly aligned in the track width direction (in the X direction). Preferably, the thickness T4 of the second insulating film 26 is 15 nm or more. The upper limit of the thickness T4 of the second insulating film 26 corresponds to a size at which an upper surface 26a of the second insulating film 26 and an upper surface 27a of the insulating barrier layer 27 are flush with each other.

As shown in FIGS. 1 and 2, preferably, the thickness T3 of the first insulating film 25 is set at a constant value. That is, the first insulating film 25 is not tapered upward. Thereby, insulation between the laminate 22 and the hard bias layer 36 through the first insulating film 25 is satisfactorily maintained at whole part, and short-circuiting between the laminate 22 and the hard bias layer 36 can be properly prevented.

Furthermore, preferably, the thickness T4 of the second insulating film 26 is also set at a constant value. Thereby, insulation between the lower shielding layer 20 and the hard bias layer 36 through the second insulating film 26 can be satisfactorily maintained at whole part, and short-circuiting between the lower shielding layer 20 and the hard bias layer 36 can be properly prevented.

At a connecting portion between the first insulating film 25 and the second insulating film 26 (i.e., a joint between the first insulating film 25 and the second insulating film 26), the film thickness fluctuates because the thickness of the first insulating film 25 changes to the thickness of the second insulating film 26. Furthermore, it is not possible to determine whether the connecting portion belongs to the first insulating film 25 or the second insulating film 26. Therefore, the thickness T3 of the first insulating film 25 and the thickness T4 of the second insulating film 26 are measured at portions excluding the connecting portion.

Preferably, the upper surface 26a of the second insulating film 26 is disposed lower than the upper surface 27a of the insulating barrier layer 27 (in a direction opposite to the Z direction). If the upper surface 26a of the second insulating film 26 is higher than the upper surface 27a of the insulating barrier layer 27, the thickness of the hard bias layer 36 overlapping the free magnetic layer 28 at each side in the track width direction decreases, and the magnitude of the bias magnetic field supplied from the hard bias layer 36 to the free magnetic layer 28 decreases. Therefore, the upper surface 26a of the second insulating film 26 is preferably disposed lower than the upper surface 27a of the insulating barrier layer 27.

Furthermore, preferably, the upper surface 26a of the second insulating film 26 is disposed higher than the upper surface 24a of the antiferromagnetic layer 27. Thereby, a thick portion of the hard bias layer 36 is more properly and easily placed so as to face each side in the track width direction of the free magnetic layer 28, and a bias magnetic field with a proper magnitude can be supplied from the hard bias layer 36 to the free magnetic layer 28.

Furthermore, as shown in FIG. 2, when the bias underlayer 35 is disposed between the second insulating film 26 and the hard bias layer 36, an upper surface 35a of the bias underlayer 35 is preferably disposed lower than the upper surface 27a of the insulating barrier layer 27. However, since the thickness of the bias underlayer 35 is not particularly large, by disposing the upper surface 26a of the second insulating layer 26 lower than the upper surface 27a of the insulating barrier layer 27, the upper surface 35a of the bias underlayer 35 is generally disposed lower than the upper surface 27a of the insulating barrier layer 27. Consequently, by controlling the height relationship between the upper surface 26a of the second insulating film 26 and the upper surface 27a of the insulating barrier layer 27, in particular, even if the layer structure and thicknesses of the individual layers in the tunneling magnetic sensing element are changed, it is possible to place a thick portion of the hard bias layer 36 so as to face each side of the free magnetic layer 28. Thus, the magnetization of the free magnetic layer 28 can be controlled properly.

Materials for each first insulating film 25 and each second insulating film 26 will now be described below. When the first insulating film 25 and the second insulating film 26 are continuously formed and each have a single-layer structure, the first insulating layer 25 and the second insulating layer 26 are each preferably composed of a material selected from the group consisting of $Al_2O_3$, $Si_3N_4$, $SiO_2$, $SiO_x$, WO, SiON, $Ta_2O_5$, $TiO_x$, and TiN. Among these, particularly preferably, the first insulating film 25 and the second insulating film 26 each are composed of $Al_2O_3$ from the standpoint that insulation between the laminate 22 and the hard bias layer 36 and between the lower shielding layer 20 and the hard bias layer 36 can be satisfactorily maintained.

Furthermore, the first insulating layer 25 and the second insulating layer 26 each may have a multilayer structure. As shown in FIG. 2, the first insulating film 25 has a two-layer structure including an inner insulating layer 40 and an outer insulating layer 41. Similarly, the second insulating film 26 has a two-layer structure including an inner insulating layer 42 and an outer insulating layer 43. As shown in FIG. 2, the inner insulating layer 40 and the inner insulating layer 42 are continuously formed, and the outer insulating layer 41 and the outer insulating layer 43 are continuously formed. The inner insulating layer 40 and the inner insulating layer 42 are directly formed on the side face 22a of the laminate 22 and the upper surface 20a of the lower shielding layer 20, respectively. As shown in FIG. 2, the thickness (in the Z direction) of the outer insulating layer 43 constituting the second insulating film 26 is greatly larger than the thickness in the track width direction (in the X direction) of the outer insulating layer 41 constituting the first insulating film 25. Such a great difference in thickness is caused by the deposition conditions for forming the outer insulating layers 41 and 43.

When the first insulating film 25 is formed so as to have a two-layer structure as shown in FIG. 2, in particular, preferably, the inner insulating layer 40 is allowed to function as an oxidation-inhibiting layer that inhibits oxidation of the laminate 22. Even if insulation is properly maintained, depending on the material of the insulating layer, a phenomenon may be observed in which the side face 22a and its vicinity are oxidized, for example, presumably because oxygen atoms present in the insulating layer enter the laminate 22. Consequently, in order to suppress such an oxidation phenomenon, a material capable of suppressing oxidation of the laminate 22 is used for the inner insulating layer 40 instead of a case in which the outer insulating layer 41 composed of a certain material is directly disposed on the side face 22a of the laminate 22. For example, the inner insulating layer 40 has a single-layer structure or a multilayer structure composed of a material or materials selected from the group consisting of $Si_3N_4$, $SiN_x$, $WO_x$, $SiO_2$, $SiO_x$, SiON, $Ta_2O_5$, $TaO_x$, and TiN. In such a case, the inner insulating layer 42 constituting the second insulating film 26 is of course formed in the same structure using the same material.

On the other hand, the properties required for the outer insulating layers 41 and 43 are, in particular, excellent insulating properties. The outer insulating layers 41 and 43 each have a single-layer structure or a multilayer structure composed of a material or materials selected from the group consisting of $Al_2O_3$, $SiO_2$, AlSiO, and SiAlON. For example, the outer insulating layer 43 is composed of $Al_2O_3$. $Al_2O_3$ has very high insulating properties. However, if $Al_2O_3$ is disposed directly on the side face 22a of the laminate 22, a phenomenon occurs in which the side face 22a and its vicinity are slightly oxidized. Therefore, for example, by selecting $Si_3N_4$ for the inner insulating layers 40 and 42 and $Al_2O_3$ for the outer insulating layers 41 and 43, insulation between the laminate 22 and the hard bias layer 36 and between the lower shielding layer 20 and the hard bias layer 36 can be satisfactorily maintained and the oxidation of the laminate 22 can be properly suppressed. As described above, by forming the outer insulating layer 43 constituting the second insulating film 26 with a large thickness and using $Al_2O_3$ or the like that has excellent insulating properties, it is possible to more properly and easily improve insulating properties of the second insulating film 26 in which insulating properties are more severely required compared with the first insulating film 25.

A tunneling magnetic sensing element has been described in this embodiment. The magnetic sensing element of the present invention may be a CPP (current-perpendicular-tothe-plane)-GMR (giant magnetoresistive) element using a giant magnetoresistance effect having a structure in which the insulating barrier layer 27 of the tunneling magnetic sensing element 21 is replaced by a nonmagnetic conductive layer, for example, composed of Cu.

A method for fabricating the tunneling magnetic sensing element shown in FIG. 1 will be described below with reference to the drawings. FIGS. 4 to 10 are partial cross-sectional views showing steps in a fabrication process for the tunneling magnetic sensing element, taken in a direction parallel to the surface facing a recording medium.

Figure 4:
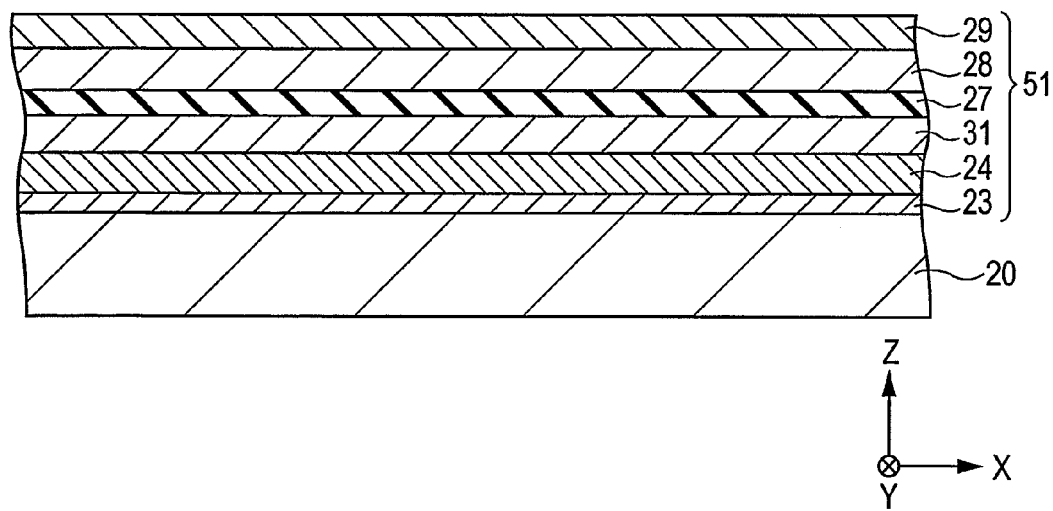
FIG. 4 is a partial cross-sectional view showing a tunneling magnetic sensing element in a fabrication step, taken in a direction parallel to the surface facing a recording medium.

In the step shown in FIG. 4, a laminate 51 is formed on a lower shielding layer 20, the laminate 51 including a seed layer 23, an antiferromagnetic layer 24, a pinned magnetic layer 31, an insulating barrier layer 27, a free magnetic layer 28, and a protective layer 29 disposed in that order from the bottom. The materials for the individual layers have been described above with reference to FIG. 1.

Figure 5:
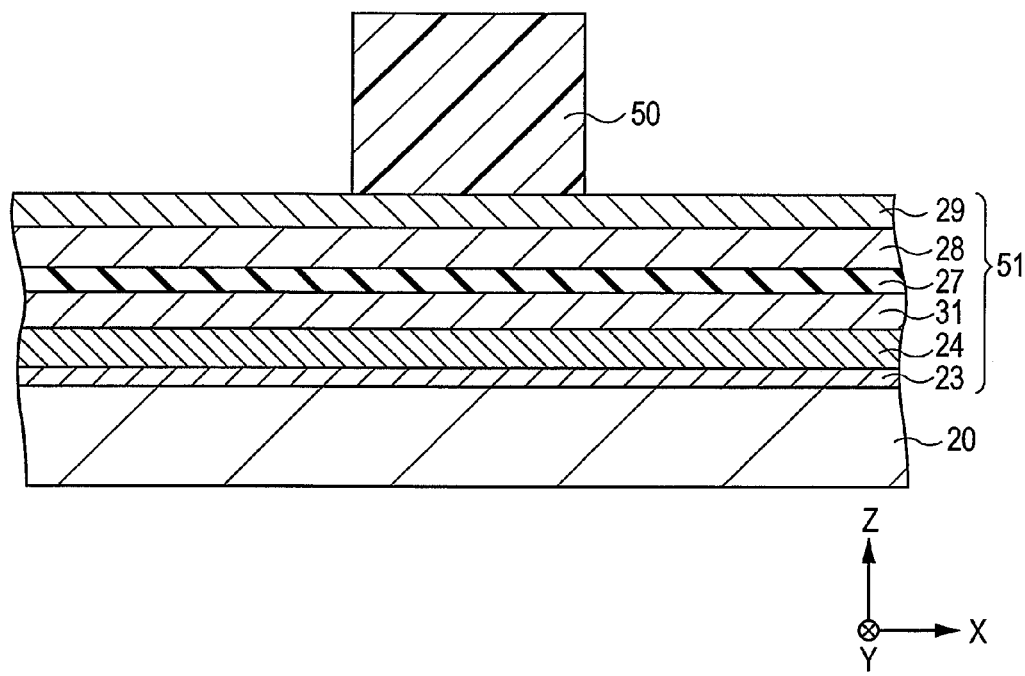
FIG. 5 is a partial cross-sectional view showing a step subsequent to that shown in FIG. 4.

In the step shown in FIG. 5, a resist layer 50 is formed on the protective layer 29. First, a resist is applied over the entire surface of the protective layer 29, and then the resulting layer is partially removed by exposure and development so that the resist layer 50 remains on the protective layer. The resist layer 50 is not a resist layer for lift-off processing. Consequently, the resist layer 50 is not provided with an undercut portion, such as that shown in FIG. 8 of Patent Document 1 (represented by reference numeral 71a of FIG. 8).

Figure 6:
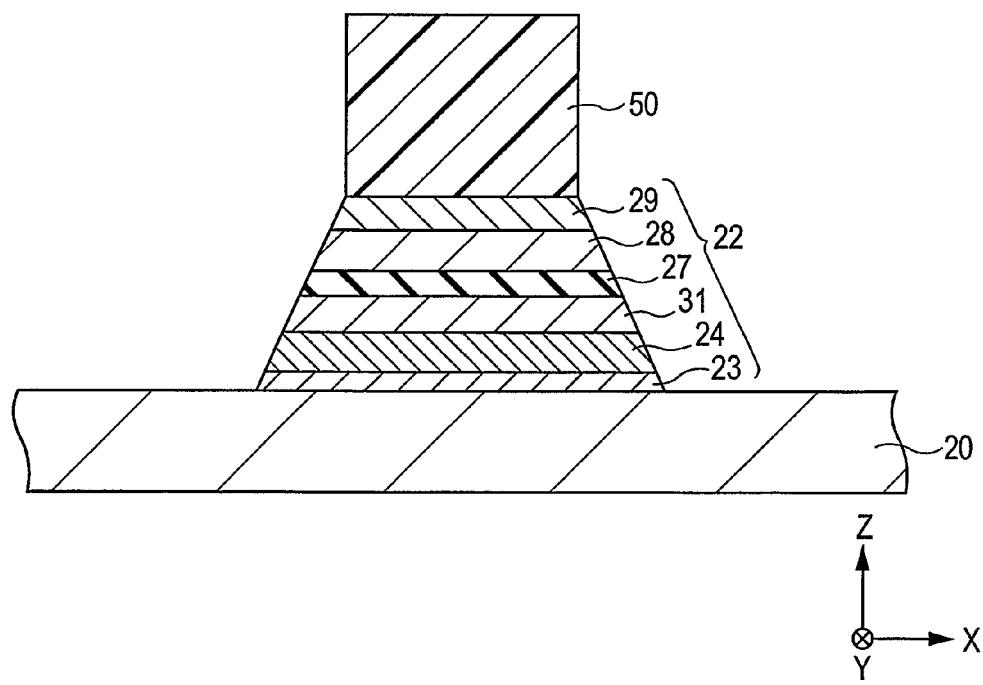
FIG. 6 is a partial cross-sectional view showing a step subsequent to that shown in FIG. 5.

In the step shown in FIG. 6, portions of the laminate 51 not covered with the resist layer 50 are removed by dry etching, such as ion milling. Thereby, a laminate 22 having a substantially trapezoidal cross section, when viewed from a surface facing a recording medium, is allowed to remain on the lower shielding layer 20.

Figure 7:
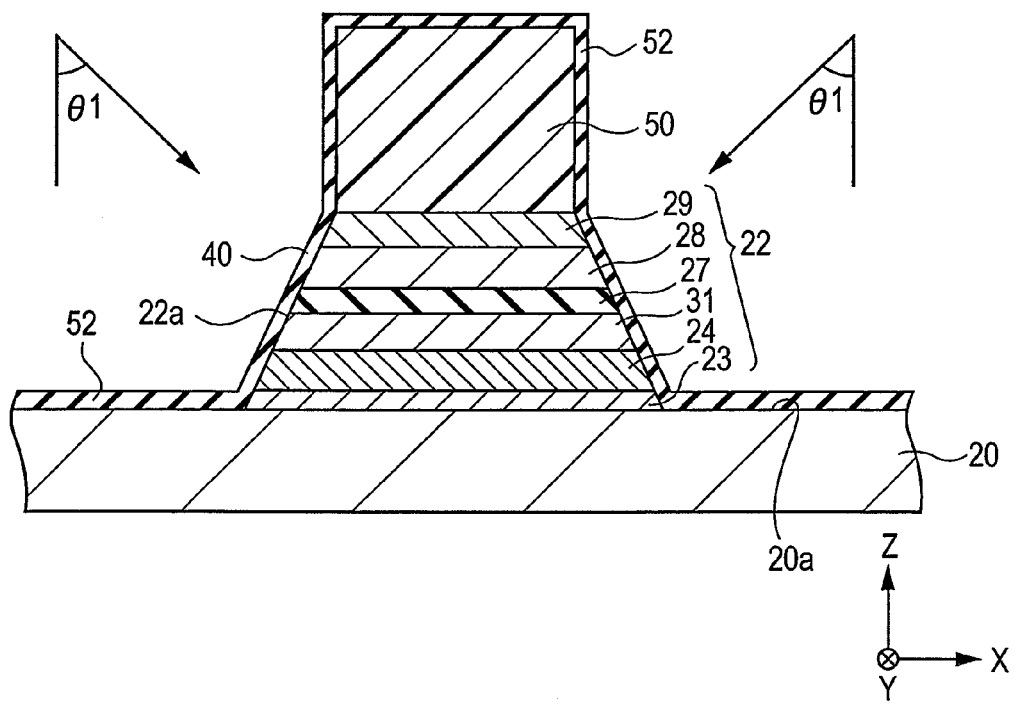
FIG. 7 is a partial cross-sectional view showing a step subsequent to that shown in FIG. 6.

In the step shown in FIG. 7, an insulating layer 52 is formed by sputtering, for example, by ion beam deposition (IBD), over the upper surface 20a of the lower shielding layer 20, the side faces 22a in the track width direction (in the X direction) of the laminate 22, and the side faces and the upper surface of the resist layer 50. Here, the sputtering angle $\theta 1$ is defined as an angle of inclination from the direction perpendicular to the upper surface 20a of the lower shielding layer 20. The sputtering angle $\theta 1$ is preferably in a range of 30° to 50°. The sputtering angle $\theta 1$ is controlled so that the insulting layer 52 can be formed over the side faces 22a of the laminate 22 and the upper surface 20a of the lower shielding layer 20 with proper thicknesses.

Portions of the insulating layer 52 finally remain as the inner insulating layers 40 of the first insulating films 25 and the inner insulating layers 42 of the second insulating films 26, which are shown in FIG. 2. Therefore, preferably, in particular, the insulating layer 52 is allowed to function as an oxidation-inhibiting layer that inhibits oxidation of the laminate 22. Even if insulation is properly maintained, depending on the material of the insulating layer 52, a phenomenon may be observed in which each side face 22a and its vicinity are oxidized, for example, presumably because oxygen atoms present in the insulating layer 52 enter the laminate 22. Consequently, in order to suppress such an oxidation phenomenon, a material capable of suppressing oxidation of the laminate 22 is used for the insulating layer 52 instead of a case in which an insulating layer 53 composed of a certain material, which will be described below, is directly disposed on the side faces 22a of the laminate 22. For example, the insulating layer 52 is preferably formed in a single-layer structure or a multilayer structure composed of a material or materials selected from the group consisting of $Si_3N_4$, $SiN_x$, $WO_x$, $SiO_2$, $SiO_x$, SiON, $Ta_2O_5$, $TaO_x$, and TiN.

Figure 8:
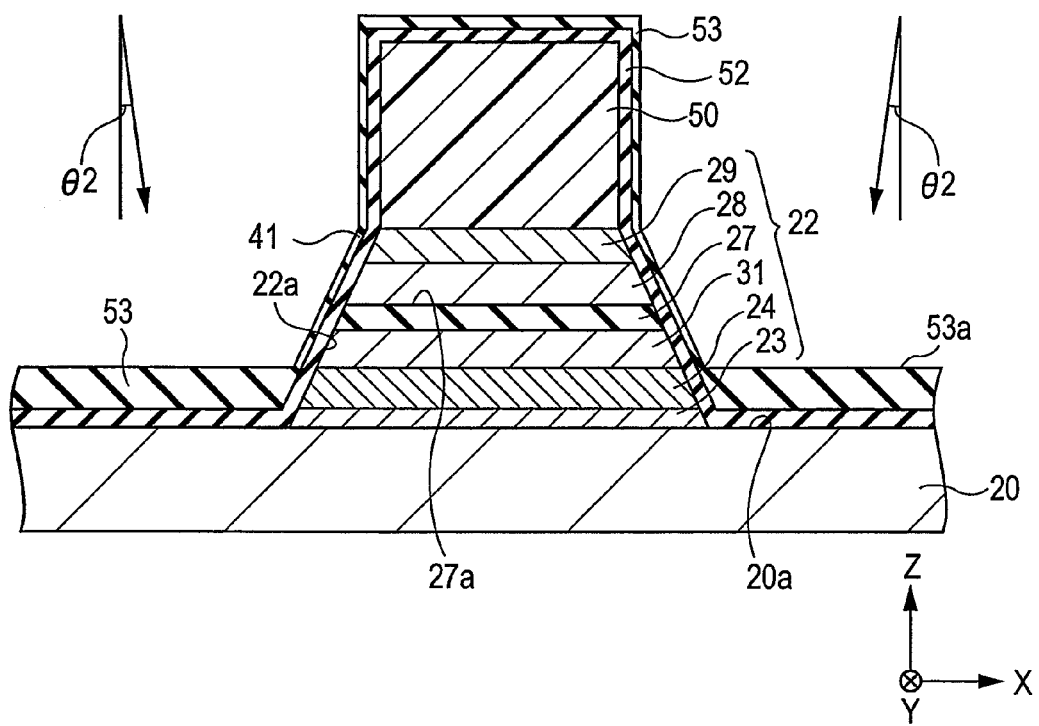
FIG. 8 is a partial cross-sectional view showing a step subsequent to that shown in FIG. 7.

Subsequently, in the step shown in FIG. 8, the insulating layer 53 is formed by sputtering, for example, by ion beam deposition (IBD), over the insulating layer 52. Here, the sputtering angle $\theta 2$ is defined as an angle of inclination from the direction perpendicular to the upper surface 20a of the lower shielding layer 20. The sputtering angle $\theta 2$ is smaller than the sputtering angle $\theta 1$ described with reference to FIG. 7. That is, the sputtering angle $\theta 2$ is closer to the direction perpendicular to the upper surface 20a of the lower shielding layer 20 compared with the sputtering angle $\theta 1$. Consequently, as shown in FIG. 8, the insulating layer 53 is more likely to be deposited on the upper surface 20a of the lower shielding layer 20 rather than being deposited on the side faces 22a of the laminate 22, and the thickness of the insulating layer 53 formed on the upper surface 20a of the lower shielding layer 20 becomes very large. The sputtering angle $\theta 2$ is preferably in a range of 0° to 30°. Portions of the insulating layer 53 finally remain as the outer insulating layers 41 of the first insulating films 25 and the outer insulating layers 43 of the second insulating films 26, which are shown in FIG. 2. Therefore, preferably, the insulating layer 53 is composed of a material having higher insulating properties than those of the insulating layer 52. Specifically, the insulating layer 53 is preferably formed in a single-layer structure or a multilayer structure composed of a material or materials selected from the group consisting of $Al_2O_3$, $SiO_2$, AlSiO, and SiAlON.

The total thickness (the thickness T4 shown in FIG. 2) of the insulating layer 52 and the insulating layer 53 formed on the lower shielding layer 20 is larger than the total thickness (the thickness T3 shown in FIG. 2) in the track width direction of the insulating layer 52 and the insulating layer 53 formed on each side face 22a of the laminate 22.

Preferably, the total thickness (the thickness T4 shown in FIG. 2) of the insulating layer 52 and the insulating layer 53 formed on the lower shielding layer 20 is controlled such that the upper surface 53a of the insulating layer 53 formed on the lower shielding layer 20 is located lower than the upper surface 27a of the insulating barrier layer 27 constituting the laminate 22.

Figure 9:
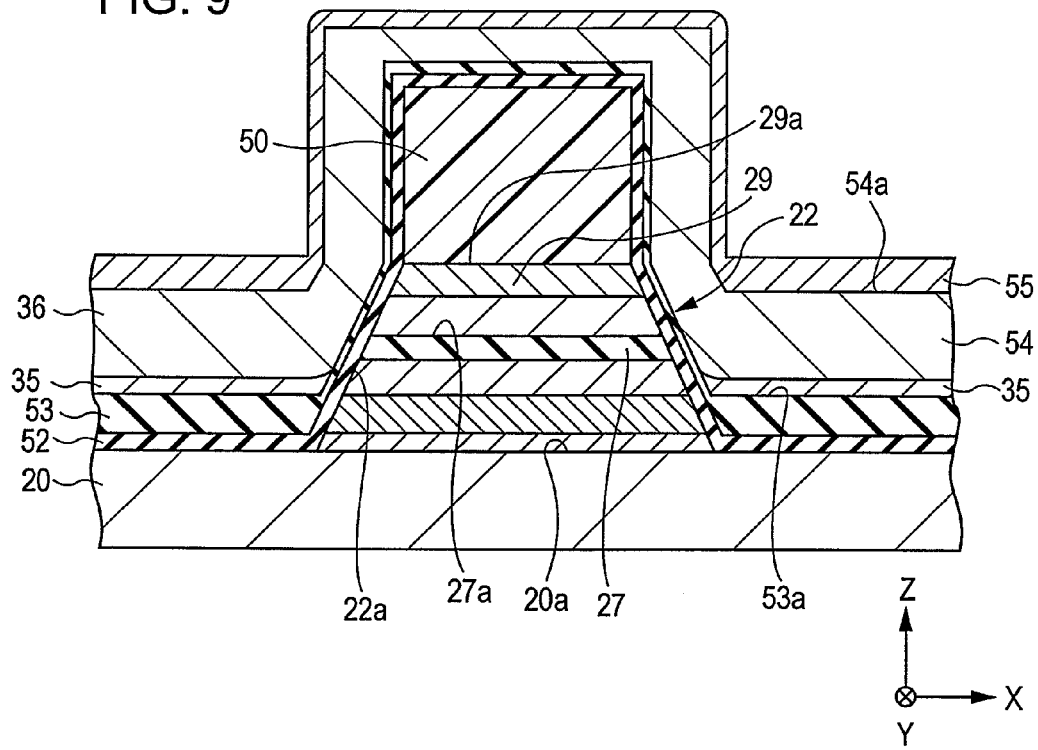
FIG. 9 is a partial cross-sectional view showing a step subsequent to that shown in FIG. 8.

Subsequently, in the step shown in FIG. 9, bias underlayers 35 are formed on portions of the insulating layer 53 which will be left as the outer insulating layers 43 of the second insulating films 26. The bias underlayers 35 are, for example, composed of Cr, CrTi, or Ta/CrTi.

Subsequently, a hard bias material layer 54, portions of which finally remain as hard bias layers 36, is formed over the insulating layer 53 and the bias underlayers 35. The hard bias material layer 54 is composed of a CoPt alloy, a CoCrPt alloy, or the like. Preferably, the hard bias material layer 54 is formed such that the upper surface 54a of a portion of the hard bias material layer 54 disposed on each bias underlayer 35 is located lower than at least the upper surface 29a of the protective layer 29, which is the uppermost layer of the laminate 22.

Subsequently, a stopper layer 55 is formed on the hard bias material layer 54. Portions of the stopper layer 55 finally remain as the protective layers 37 shown in FIG. 1. The stopper layer 55 is preferably composed of a material that has a lower milling rate than that of the hard bias material layer 54 and the resist layer 50 (at least the hard bias material layer 54). The stopper layer 55 is, for example, composed of Ta, Ti, WTi, or Mo.

Subsequently, in the step shown in FIG. 10, unnecessary layers located on the laminate 22 are removed. Here, the term "unnecessary layers" correspond to the resist layer 50, the insulating layers 52 and 53 surrounding the resist layer 50, the hard bias material layer 54 surrounding the resist layer 50, and the stopper layer 55 surrounding the resist layer 50. The unnecessary layers are removed, for example, by CMP.

Figure 10:
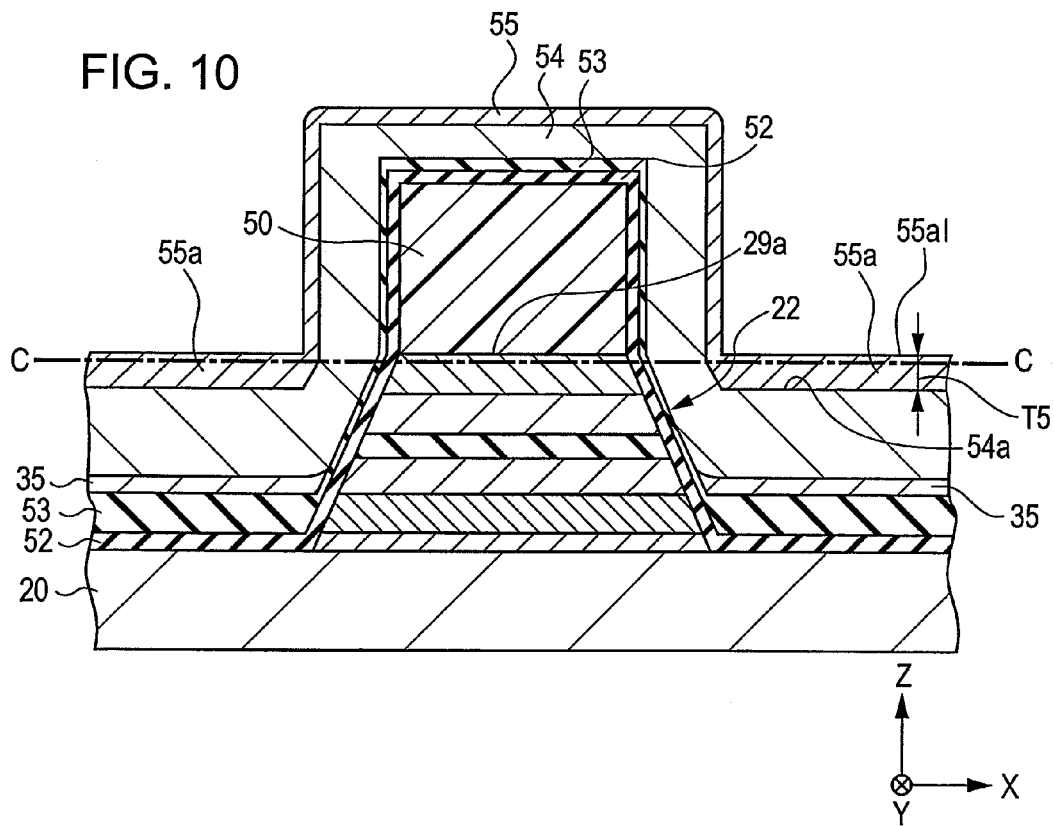
FIG. 10 is a partial cross-sectional view showing a step subsequent to that shown in FIG. 9.
Figure 11:
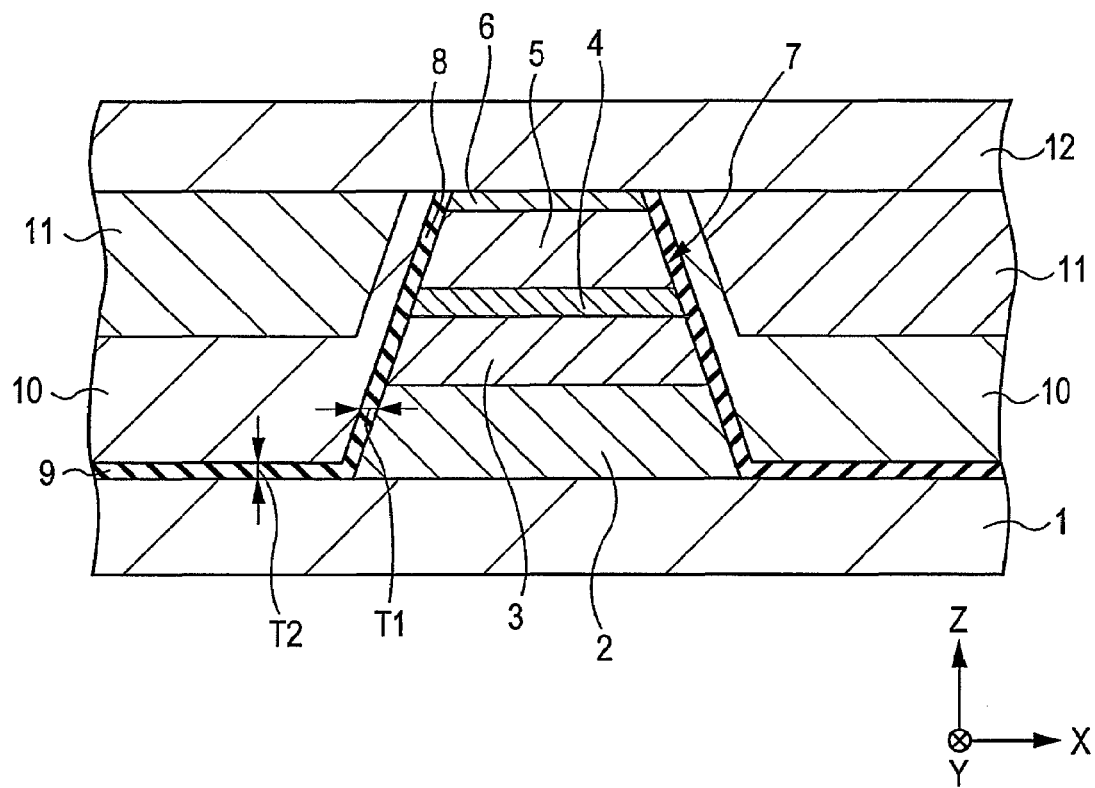
FIG. 11 is a partial cross-sectional view showing a conventional tunneling magnetic sensing element, taken in a direction parallel to the surface facing a recording medium.

As shown in FIG. 10, polishing is performed to the line C-C. Stopper layers 55a formed at both sides in the track width direction of the laminate 22 are located on the line C-C, and the stopper layers 55a are also partially removed by CMP. For example, preferably, the termination of removal by the CMP process is controlled on the basis of a remaining thickness T5 of the stopper layer 55a.

As shown in FIG. 10, the upper surface 54a of the portion of the hard bias material layer 54 disposed on each bias underlayer 35 is set lower than the upper surface 29a of the protective layer 29, which is the uppermost layer of the laminate 22, and the upper surface 55a1 of the stopper layer 55a formed at each side in the track width direction of the laminate 22 is located higher than the upper surface 29a of the protective layer 29a. As a result, in the process of removing, by CMP, all of the unnecessary layers formed on the upper surface of the laminate 22, at a certain stage, the stopper layer 55a is always polished simultaneously. At this stage, since the stopper layer 55a is also subjected to the CMP process, the polishing rate suddenly decreases, and thus it is possible to confirm that the removal by CMP is close to termination. For example, by controlling the termination of removal by the CMP process on the basis of the remaining thickness T5 of the stopper layer 55a, the CMP process can be terminated at a predetermined position.

Furthermore, the stopper layer 55a may remain as each protective layer 37 as in the embodiment shown in FIG. 1. Alternatively, by appropriately controlling the position at which the stopper layer 55a is disposed, the CMP is terminated when all the stopper layer 55a is removed such that the stopper layer 55a does not remain as the protective layer 37. However, the upper surface 54a of the portion of the hard bias material layer 54 which finally remains as the hard bias layer 36 is desirably not removed by the CMP process. Consequently, it is preferable to allow the stopper layer 55a to partially remain on the hard bias layer 36 as the protective layer 36 from the standpoint that the hard bias layer 36 with a predetermined thickness can be properly and easily disposed at each side in the track width direction of the laminate 22.

In the method for fabricating the tunneling magnetic sensing element shown in FIGS. 4 to 10, the thickness T3 in the track width direction of the first insulating film 25 formed at each side face 22a of the laminate 22 can be set smaller than the thickness T4 of the second insulating film 26 formed on the upper surface of the lower shielding layer 20.

By using two or more different sputtering angles in the steps shown in FIGS. 7 and 8, the thickness T3 of each first insulating film 25 can be properly and easily set smaller than the thickness T4 of the second insulating film 26. It may be possible to form an insulating layer at the sputtering angle θ2 shown in FIG. 8 first and then form an insulating layer at the sputtering angle θ1 shown in FIG. 7. However, by forming the insulating layer 52 first at the sputtering angle θ1 at which the insulating layer is more easily formed on the side faces 22a of the laminate 22, the insulating layer 52 is more easily allowed to have a function as an oxidation-inhibiting layer. Furthermore, by forming the insulating layer 53 having excellent insulating properties at the sputtering angle θ2 after the insulating layer 52 functioning as the oxidation-inhibiting layer is formed at the sputtering angle θ1, the thickness of the insulating layer 53 having excellent insulating properties on the upper surface 20a of the lower shielding layer 20 can be increased, and insulation can be satisfactorily maintained between each hard bias layer 36 and the lower shielding layer 20.

In the step shown in FIG. 10, the formation of the stopper layer 55 on the hard bias material layer 54 is not always necessary. However, by forming the stopper layer 55, the termination of removal by the CMP shown in FIG. 10 can be more easily controlled, and for example, it is possible to suppress the problems, such as excessive removal of the upper surface of the laminate 22 and the upper surface of each hard bias layer 36.

In the step shown in FIG. 8, preferably, the upper surface 53a of the insulating layer 53 disposed on the lower shielding layer 20 with the insulating layer 52 therebetween is set lower than at least the upper surface 27a of the insulating barrier layer 27. By controlling the position at which the upper surface 53a of the insulating layer 53 on the basis of the upper surface 27a of the insulating barrier layer 27, it is possible to place the hard bias layers 36 with an adequate thickness at both sides in the track width direction of the free magnetic layer 28 even if the layer structure of the laminate 22, the thicknesses of the individual layers, and the like are changed. For example, the optimum thickness of the antiferromagnetic layer 24 for producing a large exchange coupling magnetic field at the interface with the pinned magnetic layer 31 varies depending on the material for the antiferromagnetic layer 24. By controlling the position at which the upper surface 53a of the insulating layer 53 is formed on the basis of the upper surface 27a of the insulating barrier layer 27, regardless of the variation in the thickness of the antiferromagnetic layer 24, it is possible to place the hard bias layers 36 with an adequate thickness at both sides in the track width direction of the free magnetic layer 28.

Furthermore, in this embodiment, unlike the conventional technique, a resist layer for lift-off processing is not used. Consequently, in the resist layer 50 shown in FIG. 8, an undercut portion, such as that shown in Patent Document 1, is not formed in the lower part thereof. Since a solution for dissolving the resist layer is poured into the undercut portion, the undercut portion must be prevented from being filled with the sputtered film. Consequently, the thicknesses of the insulating layer and the hard bias layer disposed near the undercut portion cannot be increased, and in the conventional technique, the end of the insulating film is tapered or the thickness of the portion of the hard bias layer near the laminate is decreased. In contrast, in the embodiment of the present invention, since a resist layer for lift-off processing is not used, without the limitations described above, the thickness T3 of the insulating film 25 formed at each side of the laminate 22 can be set at a constant value. Furthermore, the fluctuation in the thickness of the hard bias layer 36 can be decreased. With respect to the shape of each hard bias layer 36, as shown in FIG. 1, the upper surface of the hard bias layer 36, in the portion near the laminate 22, is flush with the upper surface of the laminate 22. In the portion at a distance from the laminate 22 in the track width direction, the upper surface of the hard bias layer 36 is a planarized surface slightly lower than the upper surface of the laminate 22. Such a shape of the hard bias layer 36 results from the formation using an ordinary resist layer 50 instead of a resist layer for lift-off processing and the CMP process conducted in the step shown in FIG. 10. With respect to the formation of the insulating layers 52 and 53 and the hard bias material layer 54, in the presence of the resist layer 50, because of the shadow effect of the resist layer 50, it is likely that the thicknesses of the insulating layers 52 and 53 and the hard bias material layer 54, in portions near the resist layer 50, will be decreased. Therefore, preferably, the insulating films 52 and 53 and the hard bias material layer 54 are formed after the resist layer 50 is removed.

What is claimed is:

1. A magnetic sensing element comprising:
a laminate disposed on a conductive layer, the laminate having a structure including a pinned magnetic layer, a nonmagnetic layer, and a free magnetic layer disposed in that order from the bottom;
first insulating films disposed at both sides in the track width direction of the laminate;
second insulating films disposed on the conductive layer, the second insulating films being connected to the respective first insulating films; and
bias layers disposed over the respective first insulating films and the respective second insulating films,
wherein the thickness in the track width direction of each first insulating film is smaller than the thickness of each second insulating film,
wherein at least the first insulating films each have two layers including an inner insulating layer in contact with the laminate and an outer insulating layer disposed on the inner insulating layer.

2. The magnetic sensing element according to claim 1, wherein the inner insulating layer has a single-layer structure or composed of a material materials selected from the group consisting of $Si_3N_4$, $SiN_x$, $WO_x$, $SiO_2$, $SiO_x$, $SiON$, $Ta_2O_5$, $TaO_x$, and $TiN$.

3. The magnetic sensing element according to claim 2, wherein the inner insulating layer has a multilayer structure composed of materials selected from the group consisting of $Si_3N_4$, $SiN_x$, $WO_x$, $SiO_2$, $SiO_x$, $SiON$, $Ta_2O_5$, $TaO_x$, and $TiN$.

4. The magnetic sensing element according to claim 1, wherein the outer insulating layer has a single-layer structure composed of a material from the group consisting of $Al_2O_3$, $SiO_2$, AlSiO, and SiAlON.

5. The magnetic sensing element according to claim 1, wherein the outer insulating layer has a multilayer structure composed of a materials from the group consisting of $Al_2O_3$, $SiO_2$, AlSiO, and SiAlON.

6. The magnetic sensing element according to claim 1, wherein the inner insulating layer is an oxidation-inhibiting layer that inhibits oxidation of the laminate.

* * * * *